(12) United States Patent
Sakamoto

(10) Patent No.: US 7,310,040 B2
(45) Date of Patent: Dec. 18, 2007

(54) SEMICONDUCTOR DEVICE AND METHOD FOR MANUFACTURING SAME

(75) Inventor: Takehiko Sakamoto, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/267,248

(22) Filed: Nov. 7, 2005

(65) Prior Publication Data
US 2006/0097836 A1   May 11, 2006

(30) Foreign Application Priority Data
Nov. 5, 2004   (JP) ............................. 2004-322838

(51) Int. Cl.
*H01F 5/00* (2006.01)
(52) U.S. Cl. ..................................... 336/200
(58) Field of Classification Search ................. 336/200
See application file for complete search history.

(56) References Cited
U.S. PATENT DOCUMENTS
7,034,367 B2 * 4/2006 Kobori ..................... 257/374

FOREIGN PATENT DOCUMENTS
JP   2001-230375       8/2001
JP    2001230375 A  *  8/2001
JP   2002-110908       4/2002

* cited by examiner

*Primary Examiner*—Elvin Enad
*Assistant Examiner*—Joselito Baisa
(74) *Attorney, Agent, or Firm*—Young & Thompson

(57) ABSTRACT

The present invention provides an improved manufacturing stability of a semiconductor device provided with a spiral inductor. The semiconductor device 100 includes a silicon substrate 101, an element isolating oxide film embedded within the silicon substrate 101, a first insulating interlayer provided on the silicon substrate 101, a spiral inductor 120 provided on the first insulating interlayer, and a shielding layer, which is provided between the spiral inductor 120 and the silicon substrate 101, and elongates toward a direction along the surface of the substrate to provide a shield between the spiral inductor 120 and the silicon substrate 101. Then, a plurality of substrate remaining regions 131 formed by the silicon substrate 101 partially remaining in the element isolating oxide film in a form of islands from the upper viewpoint are selectively provided right under the polysilicon 105 in the region for forming the spiral inductor 120.

11 Claims, 12 Drawing Sheets

US 7,310,040 B2

SEMICONDUCTOR DEVICE AND METHOD FOR MANUFACTURING SAME

This application is based on Japanese patent application No. 2004-322,838, the content of which is incorporated hereinto by reference.

BACKGROUND

1. Technical Field

The present invention relates to a semiconductor device having a spiral inductor and a method for manufacturing thereof.

2. Related Art

In a radio frequency large scale integrated circuit (LSI), a spiral inductor may be mounted on the LSI, in order to employ thereof for a high frequency circuit such as LC voltage controlled oscillator (LCVCO). In semiconductor devices having a spiral inductor mounted thereon, a generation of a noise due to a coupling of the spiral inductor formed of metallic interconnects with a silicon substrate may be a problem, and a countermeasure thereof may be a provision of a shielding between the inductor and the silicon substrate.

Typical technologies for such semiconductor device include a technology described in Japanese Patent Laid-Open No. 2001-230,375. FIGS. 7 to 10 are schematic diagrams, illustrating a spiral inductor in a semiconductor device described in Japanese Patent Laid-Open No. 2001-230,375. FIG. 7 is a plan view, showing a configuration of the semiconductor device including the spiral inductor. FIG. 8 is a cross-sectional view of the semiconductor device shown in FIG. 7 along line A-A'. FIG. 9 is a schematic diagram, selectively showing layers of a polysilicon 205, a side wall 206 and a metal silicide 208, which are also shown in FIG. 7. Further, FIG. 10 is a schematic diagram, selectively showing a first layer metallic interconnect 211, a second layer metallic interconnect 214, a contact plug 210 and a via plug 213, which are also shown in FIG. 7.

This semiconductor device has a configuration including a spiral inductor composed of the first layer metallic interconnect 211, the second layer metallic interconnect 214 and the via plug 213 formed on the p-conductivity type silicon substrate 201. The first layer metallic interconnect 211 is coupled to a source/drain region 207 of a metal oxide semiconductor field effect transistor (MOSFET) via a contact plug 210 embedded in a contact hole that extends through the first insulating interlayer 209. The conductivity type of the source/drain region 207 is n-type.

Further, in order to shield the coupling of the spiral inductor with the silicon substrate 201 to provide a inhibition in the generation of noise, a polysilicon 205 is provided between the spiral inductor and the silicon substrate 201. A metal silicide 208 is provided on the upper portion of the polysilicon 205. A cut 215 for suppressing a generation of eddy current due to an influence of the inductor is provided in the polysilicon 205 and the metal silicide 208 disposed on the upper portion thereof. Further, the layout of the device is presented, such that a reduced shielding ability between the inductor and the silicon substrate 201 caused by the presence of the cut 215 is compensated by silicidizing the surface of the silicon substrate 201 so as to conform the cutout region to provide a metal silicide 208. In this configuration, an element isolating oxide film 202 is employed for an insulating film between the polysilicon 205 and the silicon substrate 201. Shallow trench isolation (STI) technology is generally employed for forming the element isolating oxide film 202.

FIG. 11 and FIG. 12 are schematic diagrams for describing another example of a spiral inductor disclosed in Japanese Patent Laid-Open No. 2001-230,375. FIG. 11 is the plan view, selectively showing layers of a polysilicon 205, a side wall 206 and a metal silicide 208 in the another example. Further, FIG. 12 is a cross-sectional view of the spiral inductor region shown in FIG. 11 along line A-A'. This configuration is distinctive from the device shown in FIGS. 7 to 10, in terms of employing a gate oxide film 204, which is provided as an insulating film between the polysilicon 205 and the silicon substrate 201 so as to contact with the upper portion of the p-type well 203.

In the meantime, Japanese Patent Laid-Open No. 2002-110,908 describes a spiral inductor having a configuration of providing a dummy element region in an inductor-forming region.

SUMMARY OF THE INVENTION

However, the present inventor have further investigated the technology described in Japanese Patent Laid-Open No. 2001-230,375, and the following facts have been clarified. In the spiral inductor shown in FIGS. 7 to 10, the element isolating oxide film 202 is formed over the entire surface right under the polysilicon 205 that is employed as the shielding. Thus, in the inductor-forming region, an area of a region where the element isolating oxide film 202 elongates is increased, and a dishing is occurred in such region of the increased area during a polishing operation for the element isolating oxide film 202 in the process for forming the element isolating oxide film 202 employing the STI technology, leading to a reduction in the film thickness of the element isolating oxide film 202, thereby arising a concern of creating unwanted field steps. Here, it is considered that such dishing is caused due to a local enhancement in the data density of the element isolating oxide film 202 (in other words, ratio of the area occupied by the element isolating oxide film 202 in the surface).

The generation of the field step leads to a fluctuation of the focusing in the photo resist (PR) operation in the later process for forming the gate electrode 222, which, in turn, results in becoming a factor for increasing a fluctuation in the dimension of the gate length. Since the element-occupying area in the spiral inductor is generally larger, that is for example, on the order of 40,000 $\mu m^2$, unevenness in the film thickness of the element isolating oxide film 202 is easily occurred, thereby providing an influence in the subsequent manufacturing process.

Further, a larger area of a region of the surface of the silicon substrate 221 is remained right under the polysilicon 205 in the spiral inductor shown in FIG. 11 and FIG. 12. Thus, an area of the region for forming the element isolating oxide film 202 in the region right under the polysilicon 205 is small, and therefore, contrary to the case of the semiconductor device shown in FIG. 7 to FIG. 10, there is a concern of increasing the thickness of the oxide film in the operation for polishing the oxide film in the process for forming the element isolating oxide film 202 employing the STI technology. It is considered that the factor thereof is a local reduction in the data density of the element isolating oxide film 202 in the inductor-forming region.

The local increase of the film thickness of the element isolating oxide film 202 leads to generating a field step, and in such case, this becomes to be a factor for increasing a fluctuation in the dimension of the gate length in the process for forming the gate electrode 222. Further, when the ratio of the area of the silicon substrate surface 221 is larger, there is a concern of decreasing the manufacturing stability, including the case that the oxide film to be removed remains on the surface of the silicon substrate 221 after completing STI process.

Further, although it is disclosed in Japanese Patent Laid-Open No. 2002-110,908 that the dummy element region described therein is provided in order to control CMP process, the investigation by the present inventors have clarified that there is a room for improvements in view of enhancing the manufacturing stability or the shielding ability, as discussed later.

According to one aspect of the present invention, there is provided a semiconductor device, comprising:

a semiconductor substrate;

an insulating film embedded in the semiconductor substrate;

an insulating interlayer provided on the semiconductor substrate;

a spiral inductor provided on the insulating interlayer; and a first shielding layer provided between the spiral inductor and the semiconductor substrate as being insulated from the surface of the semiconductor substrate, the first shielding layer elongating toward a direction along the surface of the substrate to provide a shield between the spiral inductor and the semiconductor substrate, wherein a dummy pattern composed of an embedded region of the insulating film and a remaining region of the semiconductor substrate from the upper viewpoint is provided in a predetermined region in the surface of the semiconductor substrate, wherein, in the region for forming the spiral inductor, the dummy pattern is selectively provided in the region that is right under the first shielding layer, and wherein the dummy pattern in the region for forming the spiral inductor includes a geometric relationship, in which one of the embedded region and the remaining region is partially included in the other thereof in a form of a plurality of islands.

According to another aspect of the present invention, there is provided a method for manufacturing a semiconductor device, including:

forming a dummy pattern by providing a concave portion in a semiconductor substrate and forming an insulating film so as to fill the concave portion, the dummy pattern being composed of an embedded region of the insulating film and a remaining region of the semiconductor substrate from the upper viewpoint in a predetermined region in the surface of the semiconductor substrate;

forming an electrically conducting film that functions as a shielding layer on the semiconductor substrate in the region where a spiral inductor is formed, so as to provide an insulation from the surface of the semiconductor substrate;

forming an insulating interlayer on entire of an upper surface of the semiconductor substrate provided with the electrically conducting film; and forming the spiral inductor on the insulating interlayer, wherein, in the region for forming the spiral inductor, the dummy pattern is selectively provided in the region that is right under the region where the electrically conducting film is formed, and wherein the dummy pattern in the region for forming the spiral inductor includes a geometric relationship, in which one of the embedded region and the remaining region is partially included in the other thereof in a form of a plurality of islands.

In the semiconductor device of the present invention, in the region for forming the spiral inductor in the surface of the semiconductor substrate, the dummy pattern composed of the embedded region and the remaining region is selectively provided in the region for forming the first shielding layer. In addition, in the region for forming the spiral inductor, the dummy pattern has a pattern, in which one of the embedded region and the remaining region is partially included in the other thereof in an arrangement of a plurality of islands. In the present invention, the dummy pattern in the region for forming the spiral inductor may include a geometric relationship, in which the remaining region is partially included in the embedded region in a form of a plurality of islands. In this case, a local increase of the ratio of the area occupied by the insulating film in the surface of the semiconductor substrate by elongating the embedded region of the insulating film having larger area into the surface of the substrate can be inhibited. Further, the dummy pattern in the region for forming the spiral inductor may include a geometric relationship, in which the embedded region is partially included in the remaining region in a form of a plurality of islands. In this case a local decrease of the ratio of the area occupied by the insulating film in the surface of the semiconductor substrate by providing larger area of the remaining region of semiconductor substrate can be inhibited.

As such, the present invention can prevents creating a region having an extremely different ratio of the area occupied by the insulating film in the surface of the semiconductor substrate from other region, by providing the dummy pattern. Thus, the configuration that allows an effective inhibition in the local fluctuation of the film thickness during the formation of the insulating film is presented. Therefore, the configuration that allows an inhibition in the generation of the field step in the process for manufacturing the semiconductor device provided with the spiral inductor can be provided, thereby presenting an improved manufacturing stability.

Further, according to the method of the present invention, in the region for forming the spiral inductor, the dummy pattern is selectively formed in the region that is right under the region where the electrically conducting film is formed. Therefore, the dishing and the like in the process for manufacturing the insulating film can be inhibited, so that the fluctuation in the film thickness the insulating film is inhibited. Thus, an improved manufacturing stability for the semiconductor device having the spiral inductor can be provided.

Further, according to the present invention, in the region for forming the spiral inductor, the dummy pattern is selectively provided in the region that is right under the region where the electrically conducting film is formed. Therefore, effective shielding between the spiral inductor and the semiconductor substrate can be presented, while providing an improved manufacturing stability. Thus, the coupling of the spiral inductor with the semiconductor substrate is inhibited, thereby inhibiting the generation of the noise due to such coupling.

Here, in the present invention, "in the region for forming the spiral inductor, the dummy pattern is selectively provided in the region that is right under the first shielding layer" indicates a situation where the dummy pattern is provided substantially right under the first shielding layer in the region for forming the spiral inductor and the density of the regions arranged in the form of islands in the region right under the first shielding layer is higher. Nevertheless, regions arranged in the form of islands may be provided in regions except the region for forming the first shielding layer, provided that it is not influential in the shielding ability in the region for forming the spiral inductor. Further, according to the present invention, the dummy pattern may be formed or no dummy pattern may be formed in regions except the region for forming the spiral inductor.

Further, in the present invention, the spiral inductor may be composed of a spiral-shaped interconnect. The interconnect may be composed of a single member, or may be composed of a plurality of members.

According to the present invention, a technology for providing an improved manufacturing stability for the semiconductor device having the spiral inductor is achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented. Here, in this specification, a region for forming the spiral inductor indicates, from the upper viewpoint, a whole constitution that is provided with a spiral inductor 120, and additionally includes a region between the spiral-shaped interconnects. Further, in this specification, a region for forming polysilicon indicates, from the upper viewpoint, a region where a polysilicon layer having a geometry of a shield pattern is formed, which provides a shield between the spiral inductor and the semiconductor substrate.

First Embodiment

Figure 1:
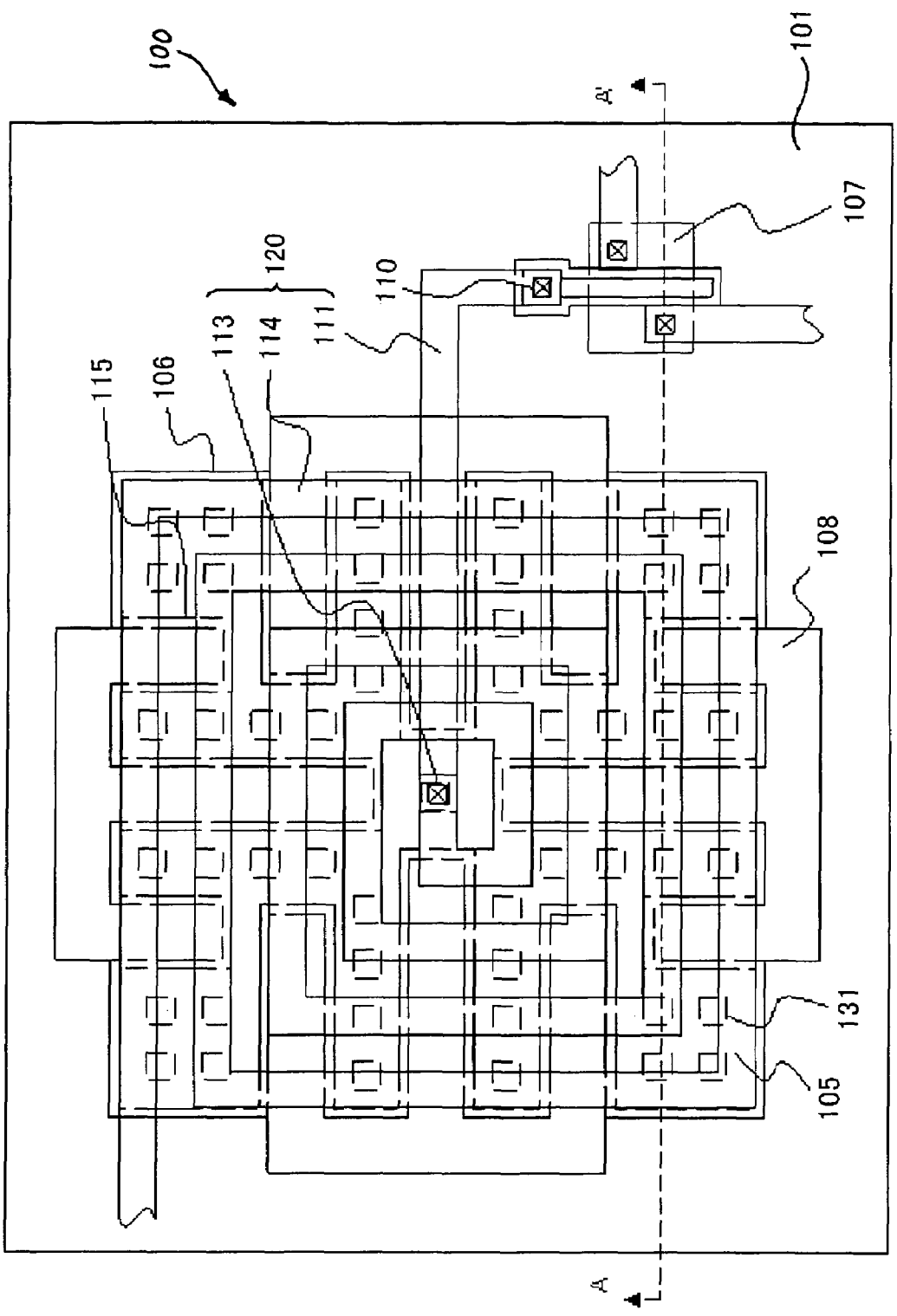
FIG. 1 is a plan view, showing a configuration of a semiconductor device according to the present embodiment.
Figure 2:
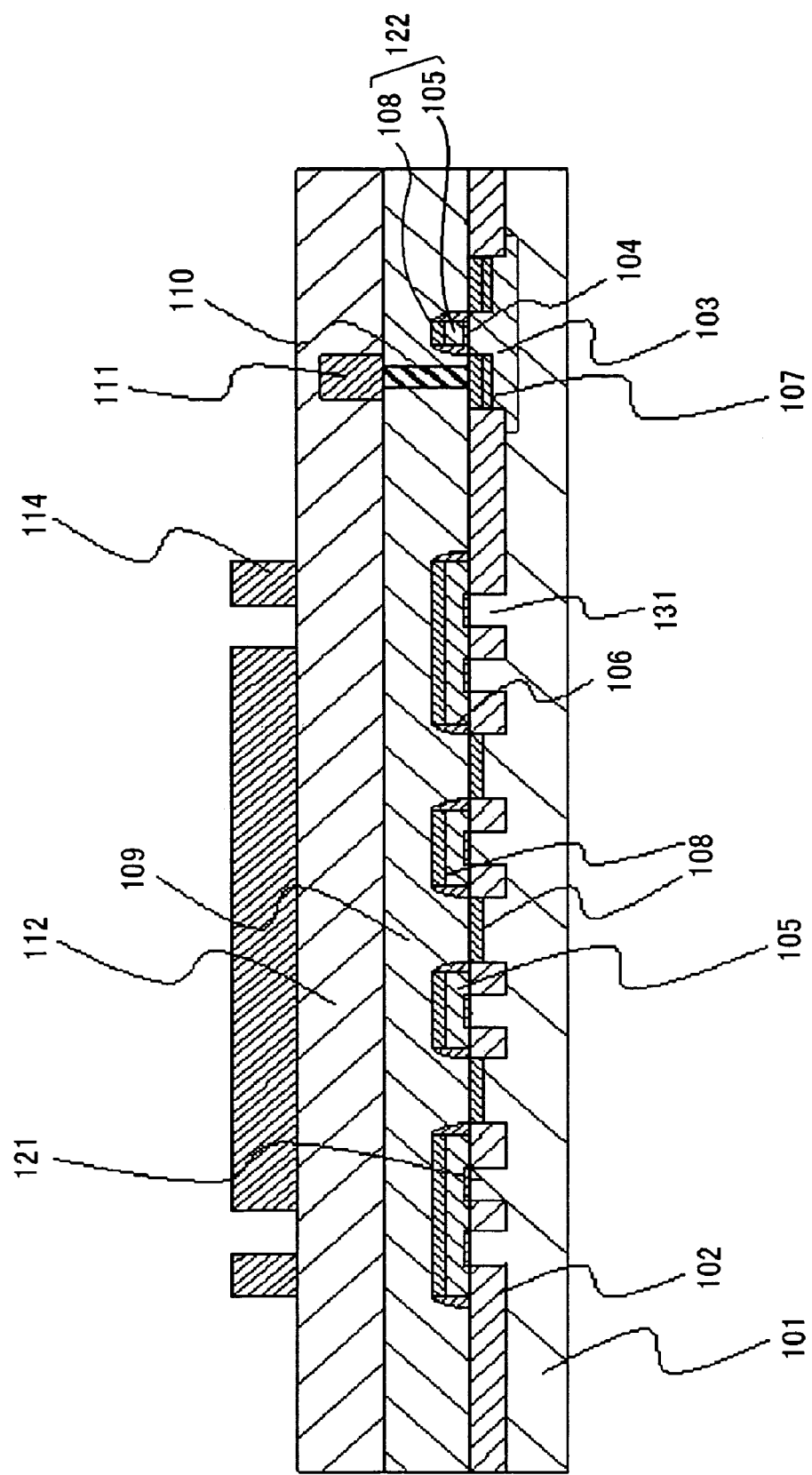
FIG. 2 is a cross-sectional view of the semiconductor device shown in FIG. 1 along line A-A'.
Figure 3:
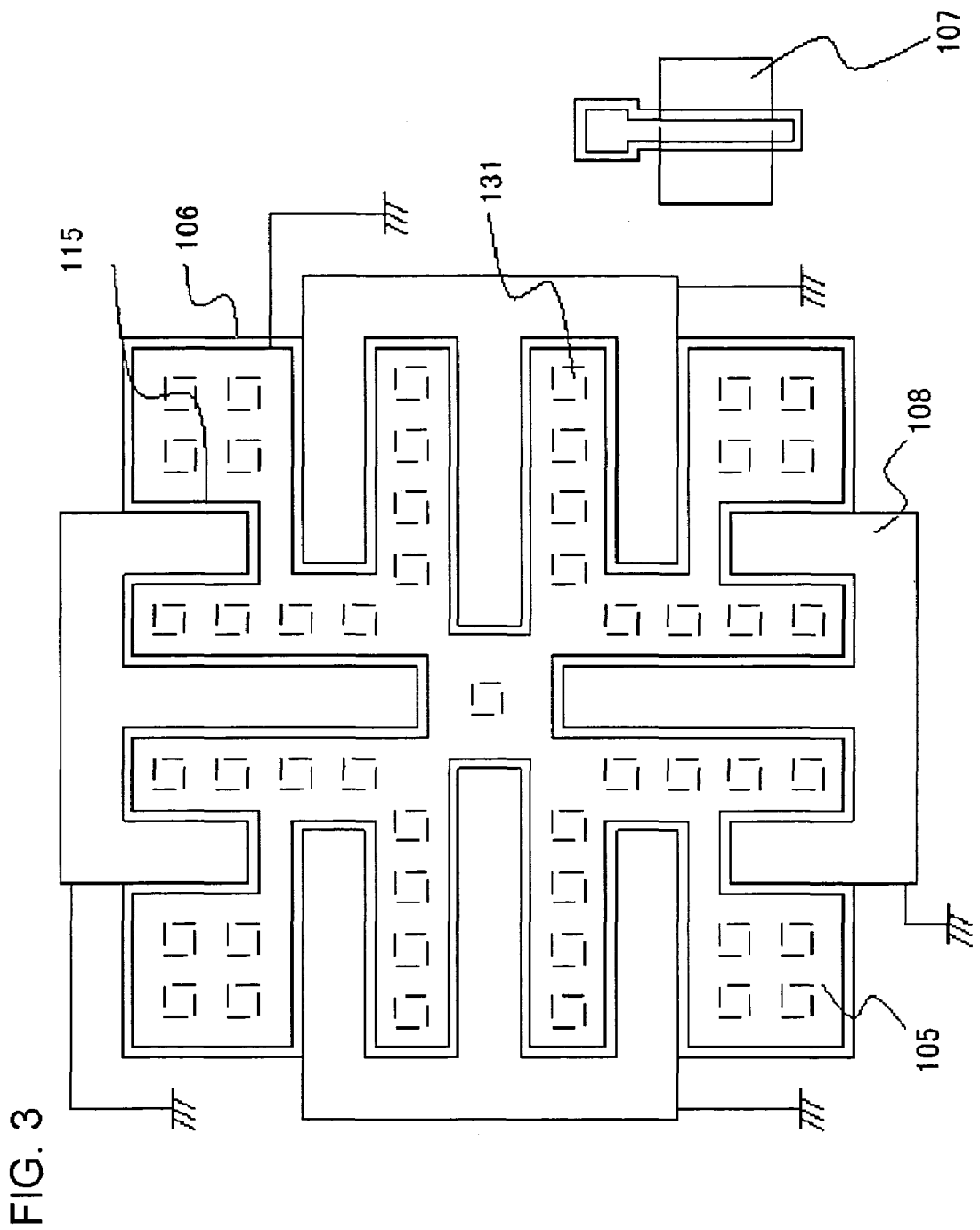
FIG. 3 is a plan view of the semiconductor device shown in FIG. 1, showing configurations of a polysilicon, a side wall, and a metal silicide.
Figure 4:
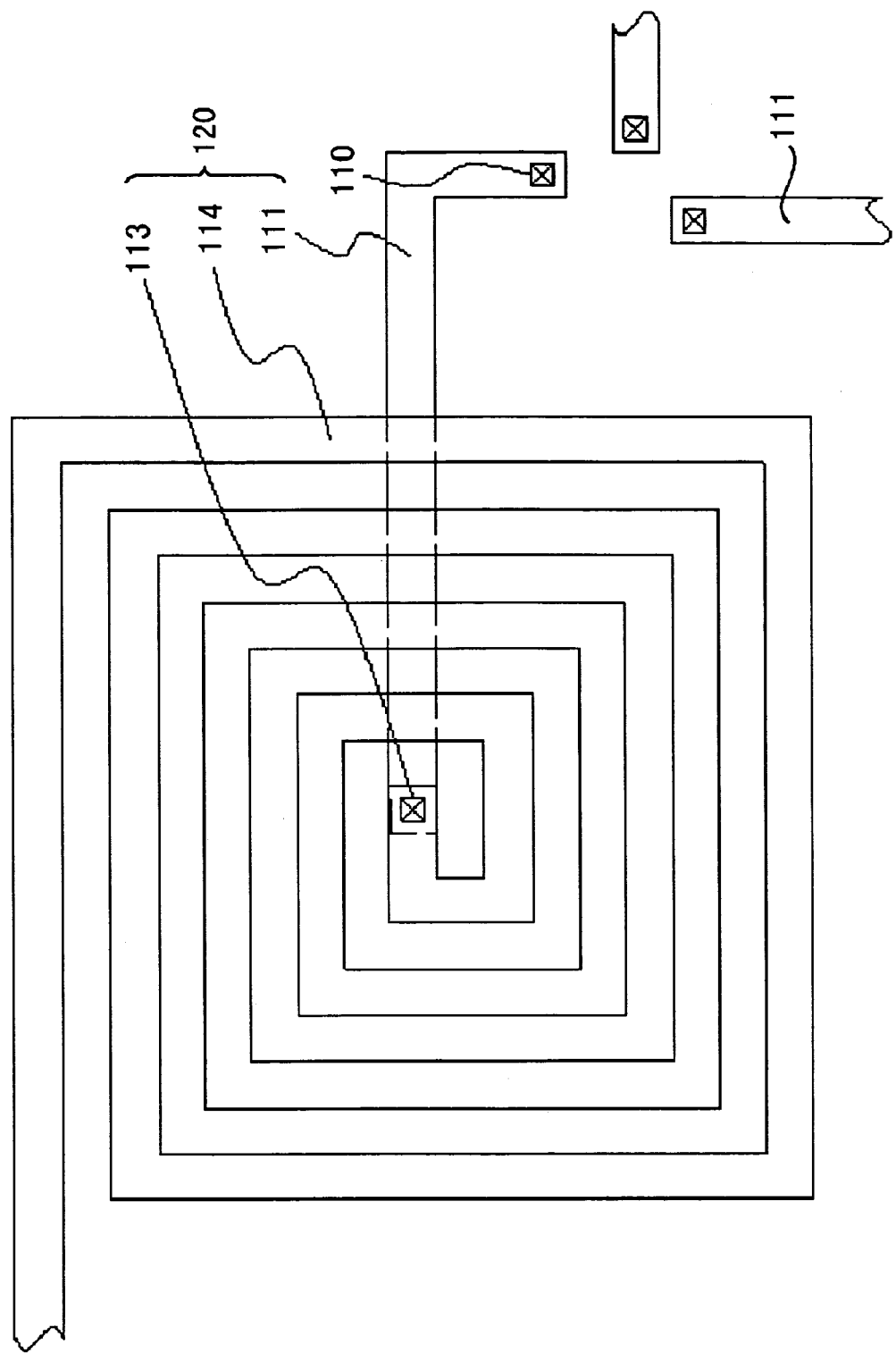
FIG. 4 is a plan view of the semiconductor device shown in FIG. 1, showing configuration of a first layer metallic interconnect, a the second layer metallic interconnect, a contact plug and a via plug.

FIG. 1 to FIG. 4 are schematic diagrams, illustrating a configuration of a semiconductor device of the present embodiment. FIG. 1 is a plan view of a semiconductor device 100. FIG. 2 is a cross-sectional view of the semiconductor device shown in FIG. 1 along a line A-A'. FIG. 3 is a plan view, showing a polysilicon (polycrystalline silicon) 105, side walls 106 and a metal silicide 108 of the semiconductor device 100 shown in FIG. 1. FIG. 4 is a plan view, showing a first layer metallic interconnects 111, a second layer metallic interconnects 114, a contact plug 110 and a via plug 113 of the semiconductor device 100 shown in FIG. 1.

The semiconductor device 100 shown in FIG. 1 to FIG. 4 includes a semiconductor substrate (silicon substrate 101), an insulating film (element isolating oxide film 102) embedded in the silicon substrate 101, an insulating interlayer (first insulating interlayer 109 and second insulating interlayer 112) provided on the silicon substrate 101, a spiral inductor 120 provided on the first insulating interlayer 109, and a first shielding layer (polysilicon 105 and metal silicide 108 disposed on the upper surface of the polysilicon 105), which are provided between the spiral inductor 120 and the silicon substrate 101 so as to be insulated from the surface of the silicon substrate 101, elongate toward the direction in the substrate surface, and provide a shield between the spiral inductor 120 and the silicon substrate 101. A dummy pattern, which is composed, from the upper viewpoint, of an embedded region of the element isolating oxide film 102 and a remaining region of the silicon substrate 101 (substrate remaining region 131), is provided in a predetermined region of the surface of the silicon substrate 101. In a region for forming the spiral inductor 120, a dummy pattern is selectively provided in a region right under the polysilicon 105. The dummy pattern in the region for forming the spiral inductor 120 has a configuration, in which one of the embedded region and the substrate remaining region 131 is partially included in the other thereof in a form of a plurality of islands.

In the present embodiment, the dummy pattern in the region for forming the spiral inductor 120 has a configuration, in which the substrate remaining region 131 is partially included in the form of a plurality of islands in the embedded region of the element isolating oxide film 102.

The first shielding layer is composed of the polysilicon 105 and the metal silicide 108 disposed on the upper side thereof, and is composed of the first electrically conducting film that is provided with a cutout portion (cut 115) extending from a circumference portion thereof toward the inside from the upper viewpoint.

Further, the semiconductor device 100 includes a second shielding layer composed of a second electrically conducting film (metal silicide 108), which is provided in the region for forming the cut 115, has a two-dimensional geometry corresponding to the two-dimensional geometry of the cut 115, and is provided so as to contact with the surface of the silicon substrate 101.

The semiconductor device 100 is manufactured by the following process:

(i) an operation for forming a dummy pattern, by providing a concave portion in the silicon substrate 101, and forming the element isolating oxide film 102 to fill the concave portion, so that the dummy pattern, which is composed of an embedded region and a substrate remaining region 131 of the element isolating oxide film 102 in a predetermined region of the surface of the silicon substrate 101 from the upper viewpoint, is formed;

(ii) an operation for forming the polysilicon 105 that functions as a shielding layer on the silicon substrate 101 in the region where the spiral inductor 120 is formed, so as to provide an insulation from the surface of the silicon substrate 101, and an operation for forming the first insulating interlayer 109 over the entire upper surface of the aforementioned semiconductor substrate provided with the polysilicon 105; and (iii) an operation for forming the spiral inductor 120 on the first insulating interlayer 109.

Then, in the region for forming the spiral inductor 120, a dummy pattern is selectively formed in the region right under the region where polysilicon 105 is formed. Further, the dummy pattern in the region for forming the spiral inductor 120 is formed so that one of the embedded region and the remaining region 103 of the element isolating oxide film 102 is partially included in the other thereof in a form of a plurality of islands.

In the present embodiment, the dummy pattern in the region for forming the spiral inductor 120 forms a dummy pattern that has the substrate remaining region 131 partially included in the embedded region of the element isolating oxide film 102 in a form of a plurality of islands.

More detailed description concerning the semiconductor device 100 (FIG. 1 to FIG. 4) will be presented as follows. The semiconductor device 100 has a configuration, in which the spiral inductor 120 is provided on the silicon substrate 101 having a conductivity type of p-type. The spiral inductor 120 is configured of a first layer metallic interconnect 111, a second layer metallic interconnect 114 that is provided on the upper portion of the first layer metallic interconnect 111 and has a two-dimensional geometry of a spiral, and a via plug 113 that provides a coupling between the first layer metallic interconnect 111 and the second layer metallic interconnect 114. The via plug 113 is an electroconductive plug, which plugs the inside of a via hole provided in the second insulating interlayer 112. The first insulating interlayer 109 is provided to contact with the surface of the silicon substrate 101, and the second insulating interlayer 112 is provided to contact with the upper surface of the first insulating interlayer 109. The first layer metallic interconnect 111 is provided to contact with the upper surface of the first insulating interlayer 109, and the second layer metallic interconnect 114 is provided to contact with the upper surface of the second insulating interlayer 112.

In addition, as shown in FIG. 2, a metal oxide semiconductor field effect transistor (MOSFET) is provided on the silicon substrate 101, The MOSFET comprises a p-type well 103 provided in vicinity of the surface of the silicon substrate 101, a gate oxide film 104 provided to contact with the surface of the p-type well 103, a gate electrode 122, which is composed of a polysilicon (polycrystalline silicon) 105 provided to contact with the upper surface of the gate oxide film 104 and a metal silicide 108 provided to contact with the upper surface of the polysilicon 105, the side wall 106 that covers the circumferential side surface of the gate electrode 122, and a source/drain region 107 provided on the upper portion of the p-type well 103 in the side of the region for forming the gate electrode 122. The conductivity type of the source/drain region 107 is n-type. Here, the upper portion of the gate electrode 122 is a metal silicide 108 that is formed by silicidizing the polysilicon 105.

The first layer metallic interconnect 111 of the spiral inductor 120 is coupled to the source/drain region 107 of the MOSFET through the contact plug 110 embedded within the contact hole extending through the first insulating interlayer 109 and the metal silicide 108 on the surface of the silicon substrate 101.

In addition, in the semiconductor device 100, the polysilicon 105 is formed to elongate over the element isolating oxide film 102 in the region for forming the spiral inductor 120. The polysilicon 105 is insulated from the upper surface of the silicon substrate 101 and the spiral inductor 120, and functions as a shield pattern that shields the silicon substrate 101 and the spiral inductor 120. The coupling between the spiral inductor 120 and the silicon substrate 101 can be shielded by providing the shield pattern between the spiral inductor 120 and the silicon substrate 101 to provide an inhibition in the generation of noise.

The polysilicon 105 is embedded within the first insulating interlayer 109, and the surface thereof is silicidized similarly as the gate electrode 122 to form the metal silicide 108. Side circumferences of the polysilicon 105 and the metal silicide 108 are covered by the side wall 106 to provide an insulation. The element isolating oxide film 102 is provided in the region for forming the polysilicon 105 and the side wall 106 of the side surface thereof in the regions for forming the spiral inductor 120, so as to selectively contact with the bottom surfaces thereof.

In addition, from the upper viewpoint, a plurality of substrate remaining regions 131, which are configured of portions of the silicon substrate 101 partially remaining in the element isolating oxide film 102, are provided. In the region for forming the spiral inductor 120, the substrate remaining regions 131 are selectively provided in the region for forming the polysilicon 105. More specifically, in the region for forming the polysilicon 105, a plurality of island like-arranged regions are remained in the silicon substrate 101 and trenches are provided in the peripheral area thereof, and the element isolating oxide film 102 is formed to fill the trenches therewith. Such plurality of island like-arranged regions is the substrate remaining region 131. In the semiconductor device 100, the two-dimensional geometries of a plurality of substrate remaining regions 131 are rectangular and all are the same geometry, and the plurality of the substrate remaining regions 131 are two-dimensionally arranged in a geometry of a tetragonal lattice to form a dot pattern.

A gate oxide film 104 is provided on the surface of the silicon substrate 101 in the location for forming the substrate remaining region 131. The polysilicon 105 contacts with the element isolating oxide film 102 or the gate oxide film 104 on the bottom surface thereof, and these insulating films provides an insulation thereof from the silicon substrate 101.

The two-dimensional geometry of the polysilicon 105 is rectangular, and more specifically a square, and cuts 115 are provided along a direction for cutting off the spiral-shaped second layer metallic interconnect 114 from the circumference toward the direction along the substrate surface for each of the four sides thereof. In the semiconductor device 100, three cuts 115 are provided for each side, and the three cuts 115 are mutually arranged in parallel to form a stripe-shaped planar geometry, and the center cut 115 is the longest, extending to the side of the center of the polysilicon 105. Two other cuts 115 have the same length. In addition, the cut 115 provided in one side is not continuous to the cut 115 provided in other side.

In addition, the surface of the silicon substrate 101 is silicidized in the region corresponding to the region for forming the cut 115 to form a metal silicide 108. From the upper viewpoint, the metal suicides 108 elongate from each side of the polysilicon 105 to the entire of the cut 115, and have convex planar geometry engaging the cut 115 that is provided to have a concave shape. The metal silicide 108 provided on the surface of the silicon substrate 101 also functions as a shield pattern. A shield pattern of the metal silicide 108 having a two-dimensional geometry corresponding to the two-dimensional geometry of the cut 115 is provided on the silicon substrate 101, so that a layout for providing an improvement, in which a deterioration in the shielding ability between the spiral inductor 120 and the silicon substrate 101 due to a presence of the cut 115 can be compensated, can be achieved. These shield patterns are mutually insulated by the side wall 106 and the element isolating oxide film 102, and both are coupled to a grounding terminal (not shown).

Next, a method for manufacturing the semiconductor device 100 shown in FIG. 1 to FIG. 4 will be described.

First, an element isolating oxide film 102 is selectively formed in a predermined region on the surface of the silicon substrate 101, by employing a known STI process. Materials for the element isolating oxide film 102 may be, for example, $SiO_2$ film. According to the present embodiment, the element isolating oxide film 102 is selectively provided in the region for forming the polysilicon 105 in the regions for forming the spiral inductor 120, and is not provided in the region for forming the cut 115. In the region for forming the polysilicon 105, the substrate remaining regions 131 are provided in the element isolating oxide film 102. More specifically, a plurality of island like-arranged regions are remained in the silicon substrate 101 to form the substrate remaining region 131, and the periphery thereof is provided with trenches, and then $SiO_2$ film is formed to fill the trenches therewith to obtain a configuration comprising the substrate remaining regions 131, the side circumference of which is covered with the element isolating oxide film 102.

Next, a p-type well 103 is formed in vicinity of the surface of the silicon substrate 101. Then, the surface of the silicon substrate 101 is oxidized to grow an $SiO_2$ film that will form a gate oxide film 104. Subsequently, a polysilicon film is deposited on the entire upper surface of the silicon substrate 101 provided with the gate oxide film 104. A mask pattern having portions corresponding to openings, which are regions thereof except the region for forming the gate electrode 122 provided on the upper portion of the p-type well 103 and the region for forming the shield pattern, is formed by employing a photolithographic technology, and the polysilicon 105 is selectively removed through such mask. Having such procedure, the polysilicon 105 composing the gate electrode 122 and the polysilicon 105 functioning as the shield pattern can be simultaneously obtained to provide the same level.

Next, an insulating film, which functions as side wall 106, of, for example, an $SiO_2$ film is deposited. Then, such $SiO_2$ film is etched back to form the side wall 106 on the side surface of the polysilicon 105. Thereafter, an n-type source/drain region 107 is formed via an ion implantation process, and then a thermal processing is conducted via a rapid thermal annealing (RTA) process to activate an impurity contained in the source/drain region 107.

Thereafter, the surface of the silicon substrate 101 of a region where the metal silicide 108 is provided and the surface of the polysilicon 105 are exposed. Then, a metal of, for example, a cobalt (Co) film is formed on the entire upper surface of the silicon substrate 101. This is thermally processed to form layers of the metal silicide 108, which are respectively formed on the polysilicon 105 composing the gate electrode 122 of the MOSFET, the source/drain region 107, the polysilicon 105 right under a region where the spiral inductor 120 is to be formed, and the surface of the silicon substrate 101 in a region for forming the cut 115.

Thereafter, the first insulating interlayer 109 is deposited on the entire upper surface of the silicon substrate 101, a contact hole is formed in a region for providing the contact plug 110 by employing a photolithography and an etching. The contact hole is filled with a film of a metal such as tungsten (W), and thereafter, a film of a metal such as aluminum (Al) is deposited. The metallic films provided on the upper portion of the first insulating interlayer 109 except the region for forming the first layer metallic interconnect 111 is removed via a photolithography and an etching to obtain the contact plug 110 and the first layer metallic interconnect 111.

Then, the second insulating interlayer 112 is formed on the entire upper surface of the first insulating interlayer 109, and a via hole is formed via a photolithography and an etching. The via hole is plugged with a film of a metal such as tungsten and the like that will be a via plug 113, and thereafter, a film of a metal such as aluminum is deposited. Metallic films provided on the upper portion of the second insulating interlayer 112 except the region for forming the second layer metallic interconnect 114 is removed via a photolithography and an etching to obtain the via plug 113 and the second layer metallic interconnect 114. The semiconductor device 100 is obtained by the above-mentioned process.

In this case, the first insulating interlayer 109 and the second insulating interlayer 112 may be, for example, $SiO_2$ films. Alternatively, these insulating interlayers may be low dielectric constant films. Here, in this specification, the low dielectric constant film means a film having a relative dielectric constant k of, for example, equal to or less than 3.5. Such films may include, for example, SiOC film, hydrogenated polysiloxane film, methyl polysiloxane film, hydrogenated methyl polysiloxane film, or porosified films thereof. In addition, an organic polymer may be employed for the low dielectric constant film.

Next, the advantageous effects obtainable by employing the semiconductor device 100 shown in FIG. 1 to FIG. 4 will be described. In the semiconductor device 100, in the region for forming the spiral inductor 120, defective parts are provided in the element isolating oxide film 102 selectively in the region right under the polysilicon 105 to form a plurality of substrate remaining regions 131, and these substrate remaining regions 131 are two-dimensionally arranged in a form of a tetragonal lattice to constitute a dot like-arranged dummy pattern. The substrate remaining regions 131 function as a pattern for inhibiting a variation in the film thickness during the process for manufacturing the element isolating oxide film 102 (namely, polishing process). Thus, concerning the region for forming the spiral inductor 120, which has, in general, larger area, a dishing caused in the process for polishing the oxide film that will be the element isolating oxide film 102 can be inhibited, as compared with a configuration having the element isolating oxide film 102 extending in flat-plate shape to have larger area. Thus, the generation of the field step can be inhibited in the process for forming the element isolating oxide film 102 by STI process. Accordingly, a configuration is provided, which can inhibit the dimensional fluctuation of the gate length in the process for forming the gate electrode 122 after forming the element isolating oxide film 102.

It is considered that this is because local excessive increase of data density in the element isolating oxide film 102 (ratio of area occupied by element isolating oxide film 102) can be restrained by providing the substrate remaining region 131, so that the data density thereof can be closer to the data density in the element isolating oxide film 102 except for the region for forming the spiral inductor 120, thereby providing a uniform data density in the element isolating oxide film 102 on the silicon substrate 101.

In addition, since the polysilicon 105 is provided with the cut 115 extending along the direction for cutting off the spiral-shaped second layer metallic interconnect 114, generation of an eddy current can be inhibited as compared with a case of providing a flat plate-shaped shield pattern having no cut 115, to prevent a decrease in quality factor (Q value).

In addition, in the semiconductor device 100, two shield patterns of a shield pattern composing the metal silicide 108 provided on the surface of the silicon substrate 101 and a shield pattern composing the multi-layered film of the polysilicon 105 and the metal silicide 108 are disposed in the substrate surface to mutually engage. Thus, a decrease in the shielding ability of the portion for forming the cut 115 can be more surely inhibited even in the case where the polysilicon 105 is provided with the cut 115, and therefore generation of substrate noise due to a coupling of the second layer metallic interconnect 114 with the silicon substrate 101 can be more effectively prevented. Here, two-dimensional geometry of the polysilicon 105 and number of the cut 115 are not limited to that contained in the aspects of the present invention illustrated here in reference to the annexed figures, and it is sufficient to have a configuration that ensures an inhibition in the eddy current and an exhibition of the shielding ability by the polysilicon 105 and the metal silicide 108 on the surface of the silicon substrate 101.

As described above, the configuration for inhibiting the decrease of the quality factor and providing an improved manufacturing stability without deteriorating the shielding ability between the spiral inductor 120 and the silicon substrate 101, can be achieved in the semiconductor device 100.

Here, when the technology described in Japanese Patent Laid-Open No. 2001-230,375 (FIG. 7, for example) is combined with the technology described Japanese Patent Laid-Open No. 2002-110,908 described above in the description of the related art, the dummy pattern described in Japanese Patent Laid-Open No. 2002-110,908 is disposed over the entire region for forming the spiral inductor and the vicinity thereof, and therefore the dummy pattern is disposed in the region right under the metal silicide 208 of the surface of the silicon substrate 201 formed by conforming to the cut 215 of the polysilicon 205, as well as in the region right under the polysilicon 205.

Figure 7:
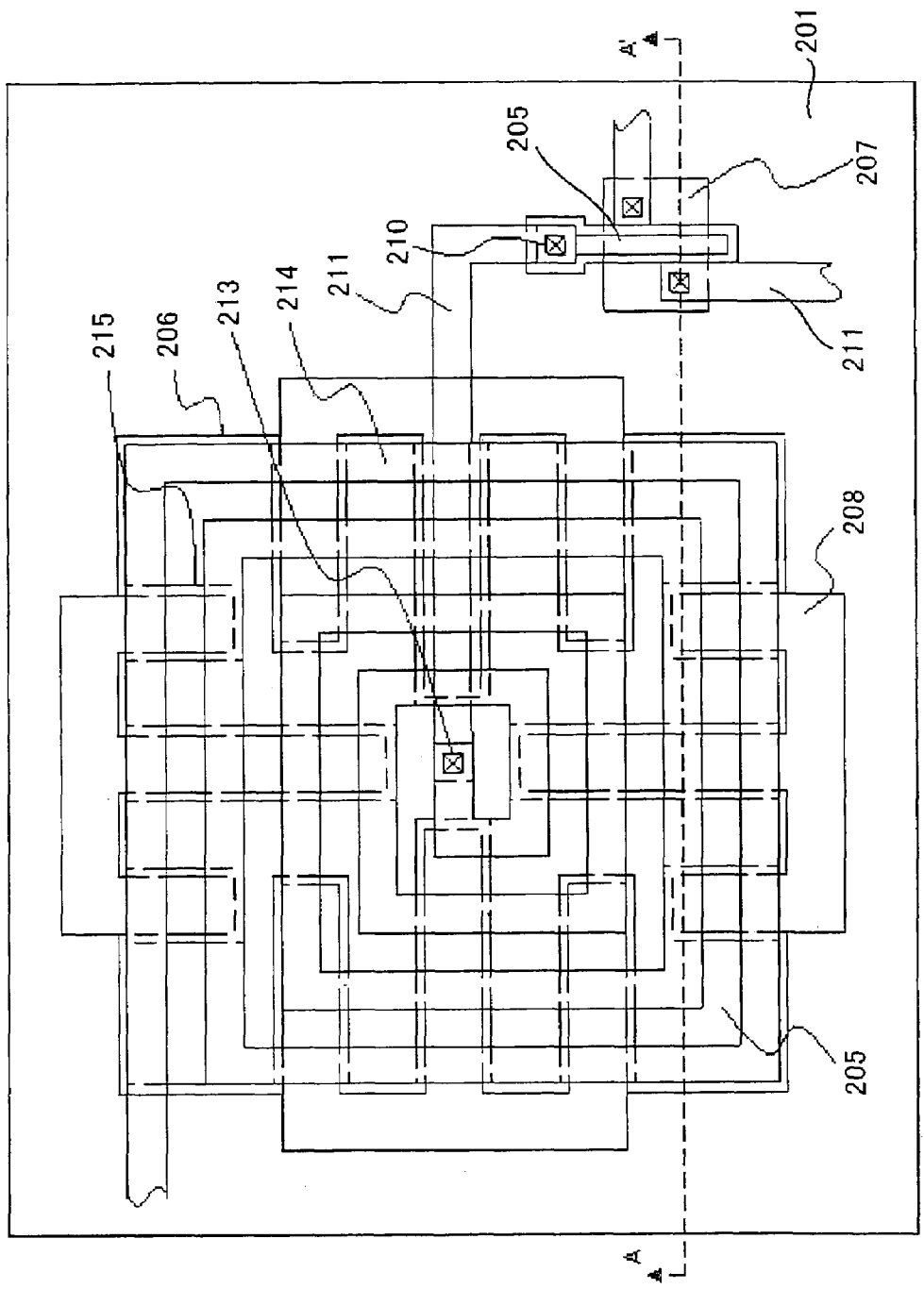
FIG. 7 is a plan view, showing a configuration of a conventional semiconductor device.
Figure 8:
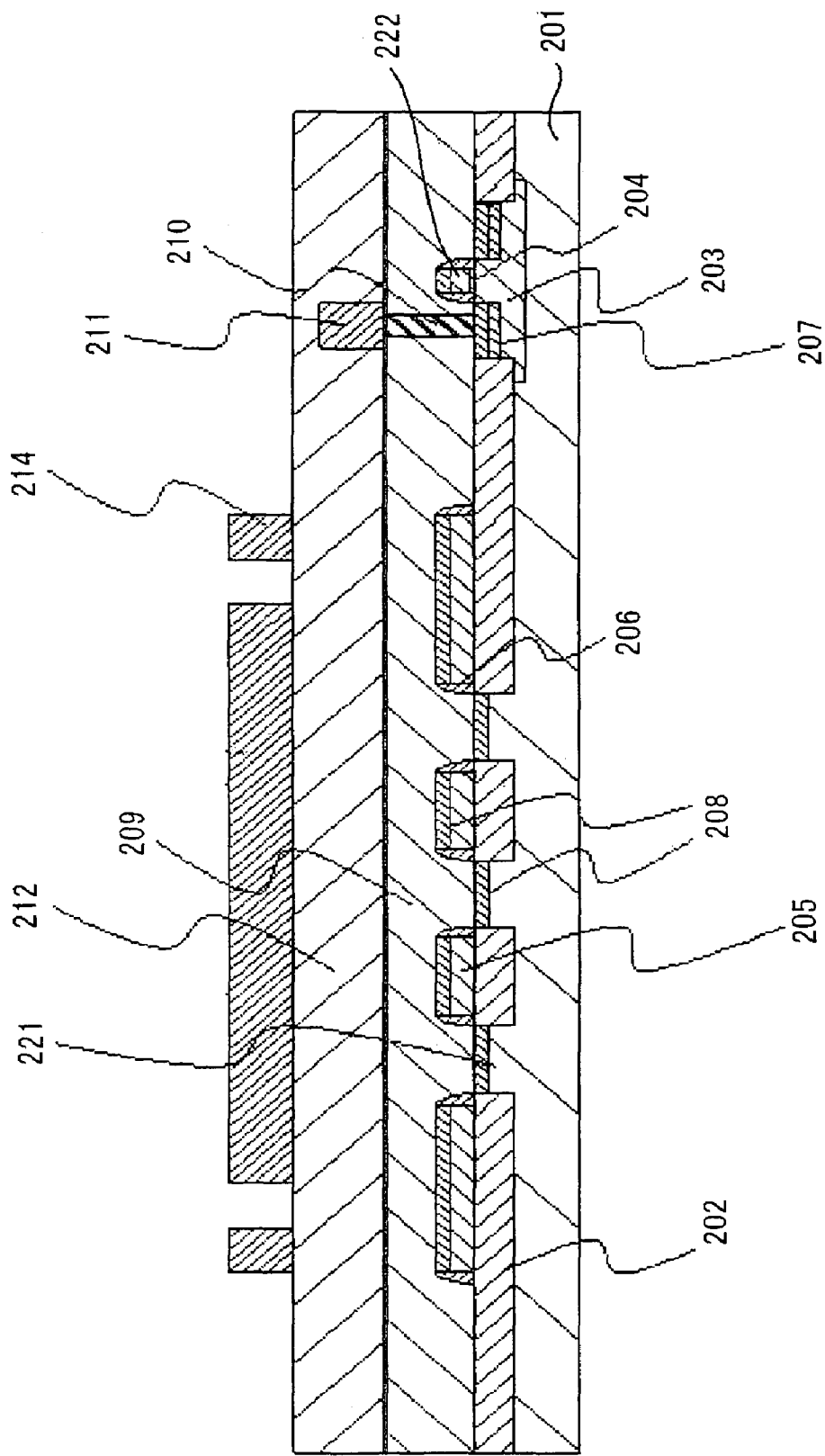
FIG. 8 is a cross-sectional view of the semiconductor device shown in FIG. 8 along line A-A'.
Figure 9:
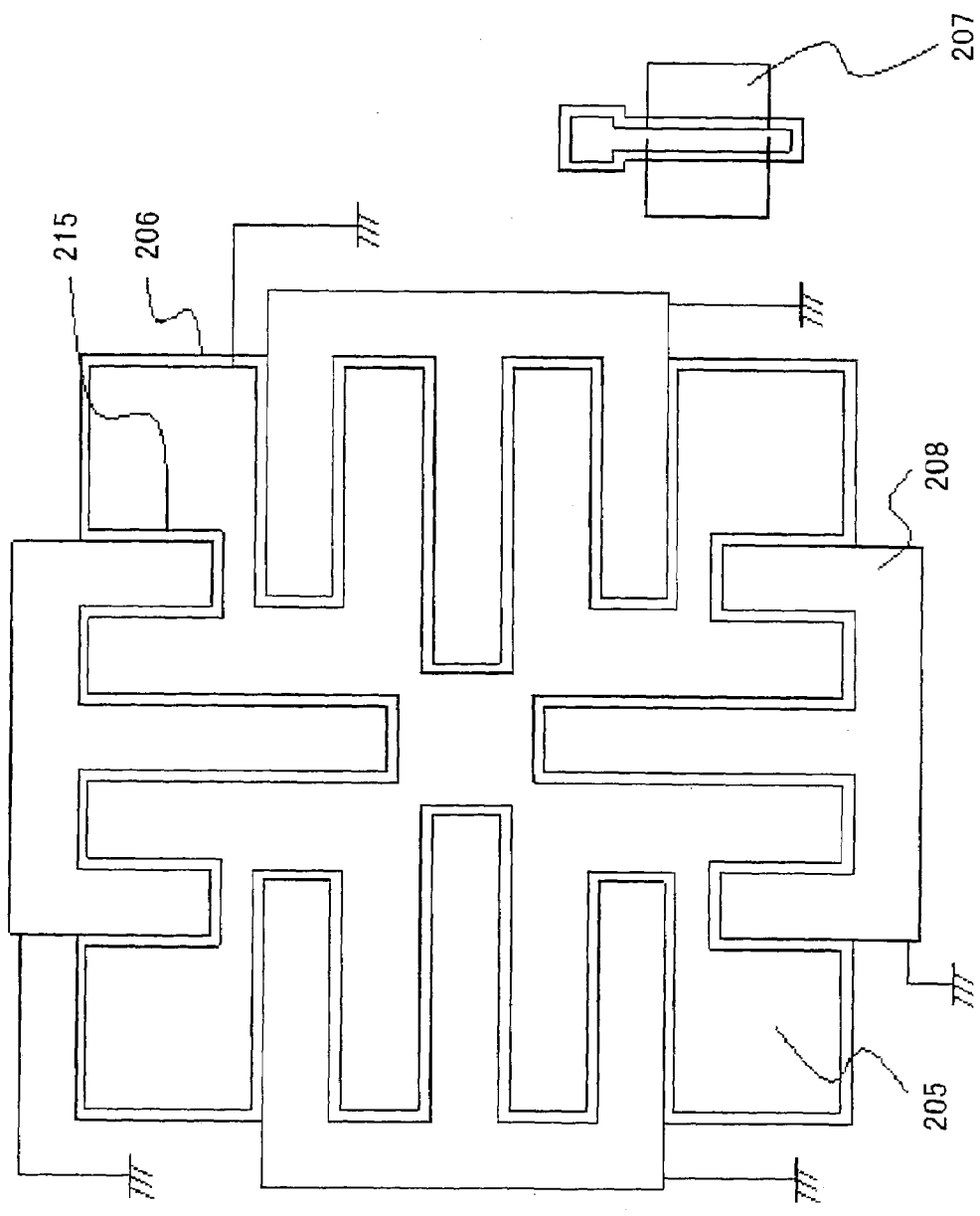
FIG. 9 is a plan view of the semiconductor device shown in FIG. 7, showing configurations of a polysilicon, a side wall, and a metal silicide.
Figure 10:
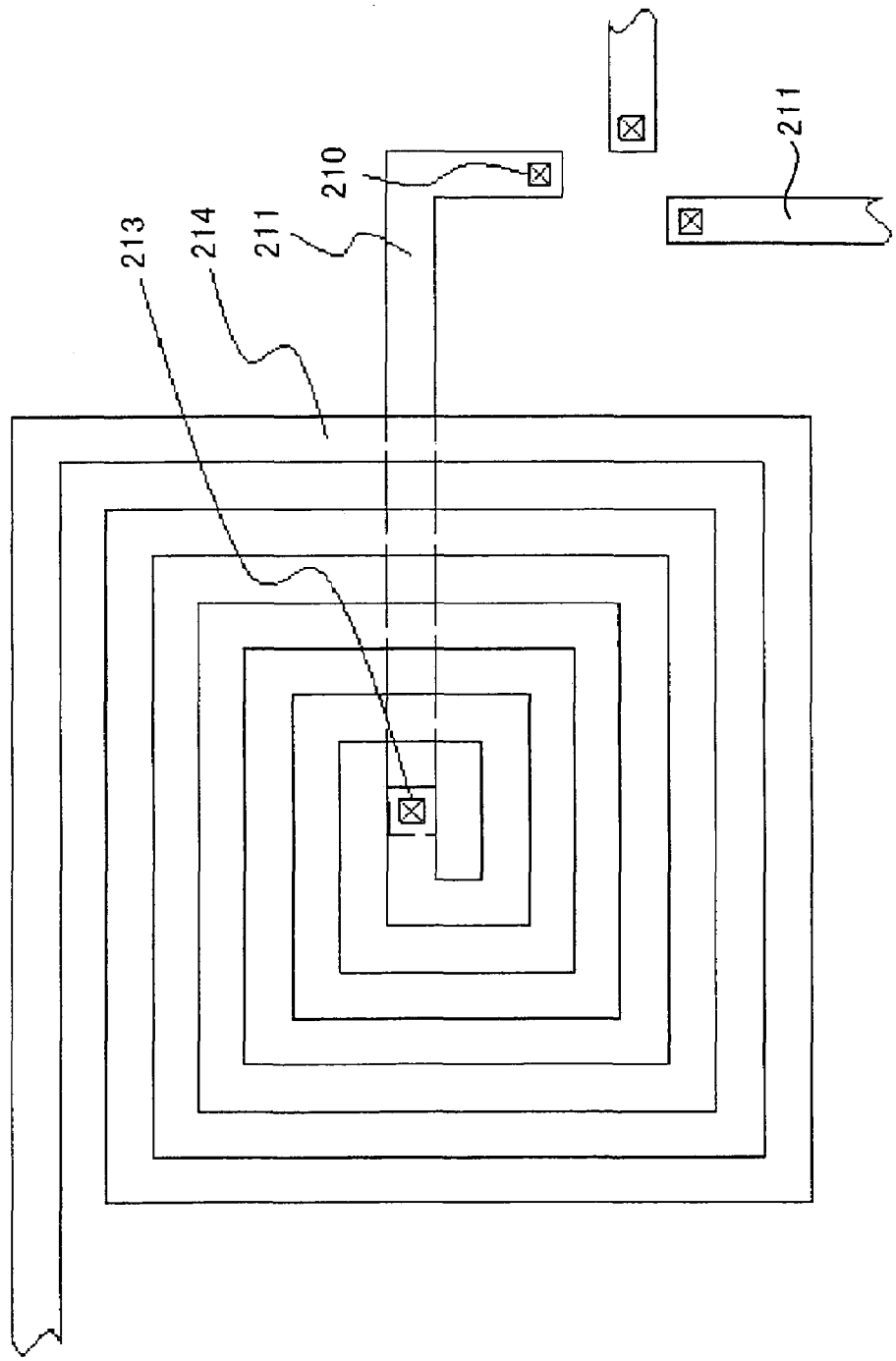
FIG. 10 is a plan view of the semiconductor device shown in FIG. 7, showing configuration of a first layer metallic interconnect, a the second layer metallic interconnect, a contact plug and a via plug.

However, the investigation of the present inventors have clarified that, in the configuration of FIG. 7, for example, when the dummy pattern is to be provided right under the metal silicide 208 of the surface of the silicon substrate 201, the region for forming the dummy pattern is to be provided with the isolating oxide film 202, and therefore the exposed area of the surface of the silicon substrate 201 is reduced to lead a reduction in the area of the region where the metal silicide 208 is formed. This deteriorates the shielding ability between the spiral inductor and the silicon substrate 201, and thus it is clarified that there is a concern of considerably generating the noise by the coupling.

In addition, Japanese Patent Laid-Open No. 2002-110,908 also describes a configuration of providing the dummy pattern only in the region except the region for forming the spiral interconnect. However, in the case of such configuration, there is a concern that the inhibition in generating the noise is insufficient because of the reduction in the area of the region for forming the metal silicide 208 stated above. In addition, since the element isolating oxide film 202 is provided on the entire surface right under the region for forming the spiral interconnect, a dishing is easy to be occurred in the element isolating oxide film 202, and thus there is a concern that the inhibition in creating the field step is insufficient.

On the contrary, in the configuration according to the present embodiment, the dot like-arranged substrate remaining regions 131 are provided selectively in the region for forming the polysilicon that is insulated by the upper surface of the silicon substrate 101, and no dot like-arranged substrate remaining regions 131 are provided in the lower portion of the metal silicide 108 that is provided to contact with the silicon substrate 101. Thus, the entire region corresponding to the shape of the cut 115 is provided with the metal silicide 108 by employing a simple process for simultaneously silicidizing the silicon substrate 101 and the polysilicon 105 to provide a function as a shield pattern. Thus, the configuration for allowing the sufficient inhibition in the deterioration of the shielding ability while ensuring the sufficient inhibition in the dishing during the formation of the element isolating oxide film 102 can be presented.

Second Embodiment

While the case of the dummy pattern having the island like-arranged substrate remaining regions 131 remaining in the element isolating oxide film 102 has been illustrated in first embodiment, the dummy pattern may alternatively be a pattern that is an inverted pattern of the element isolating oxide film 102 with the substrate remaining region 131. In the present embodiment, a semiconductor device of a configuration having a dummy pattern that is an inverted pattern of the element isolating oxide film 102 with the substrate remaining region 131 will be described by focusing points that are different from first embodiment.

Figure 5:
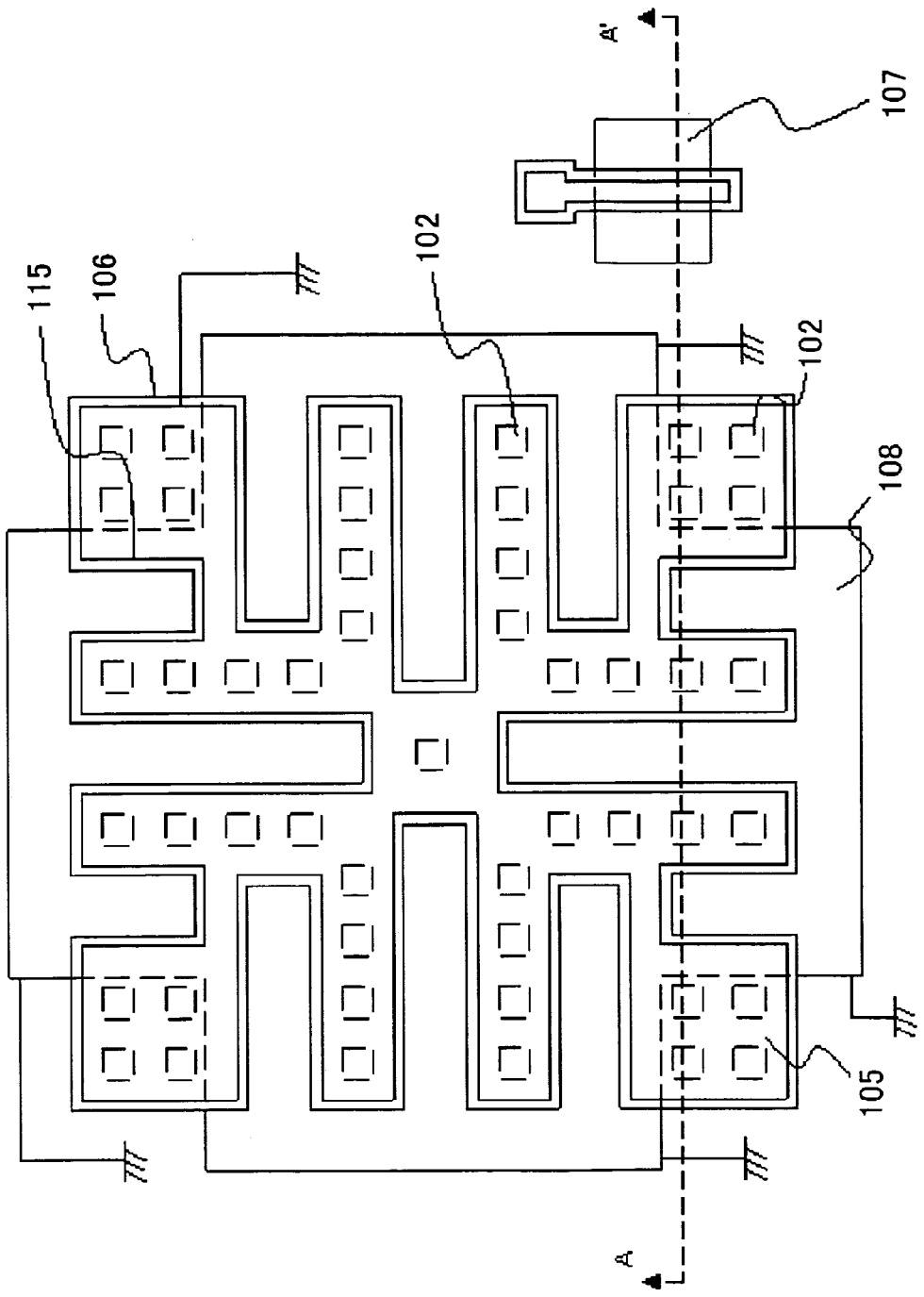
FIG. 5 is a plan view of the semiconductor device according to the present embodiment, showing configurations of a polysilicon, a side wall and a metal silicide.
Figure 6:
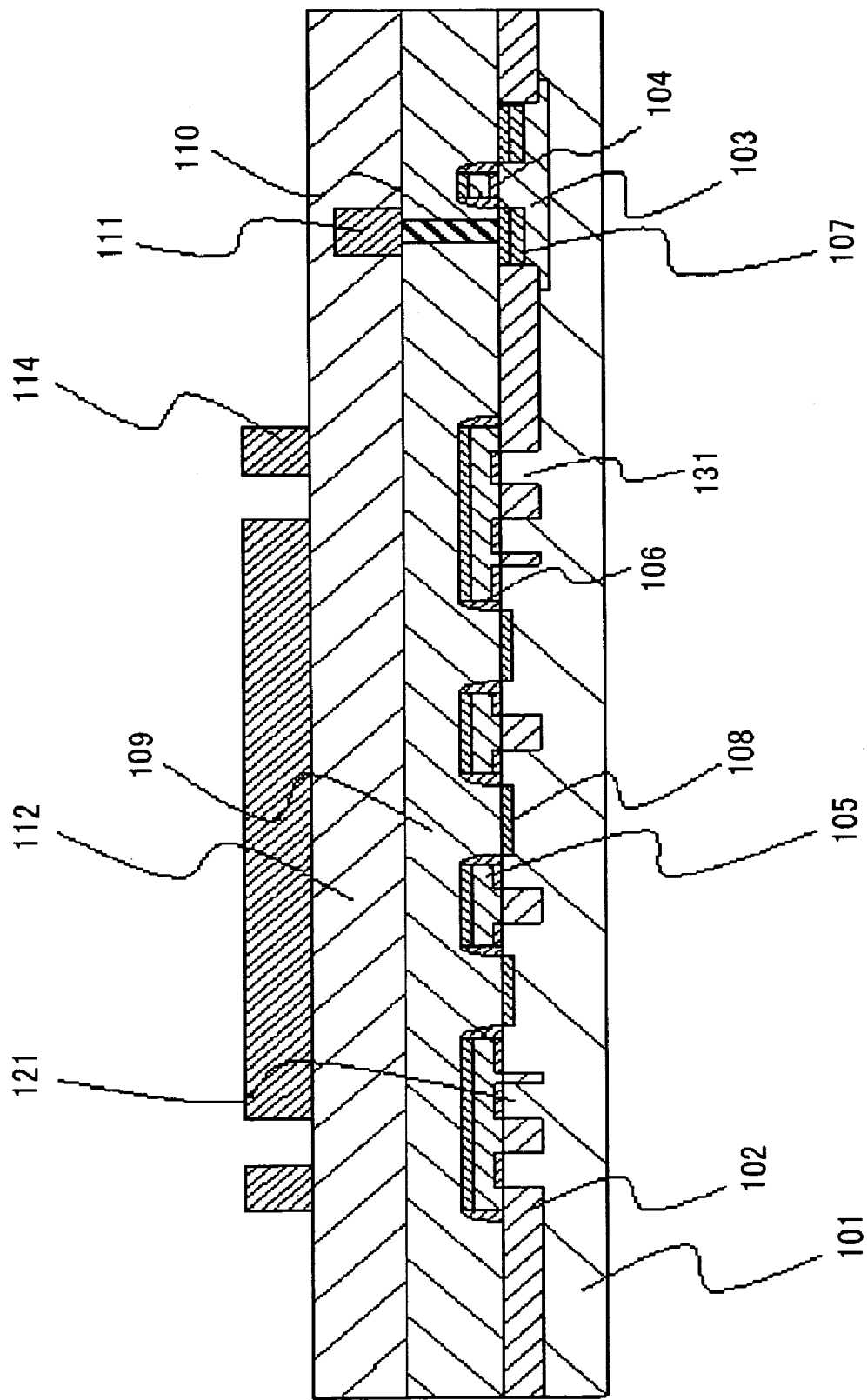
FIG. 6 is a cross-sectional view of the semiconductor device shown in FIG. 5 along line A-A'.

FIG. 5 and FIG. 6 are diagrams, illustrating a configuration of a semiconductor device according to the present embodiment. FIG. 5 a plan view showing a polysilicon 105, side wall 106, and a metal silicide 108 of the semiconductor device. FIG. 6 is a cross-sectional view of a semiconductor device, showing a cross section along line A-A' appeared in FIG. 5.

Figure 11:
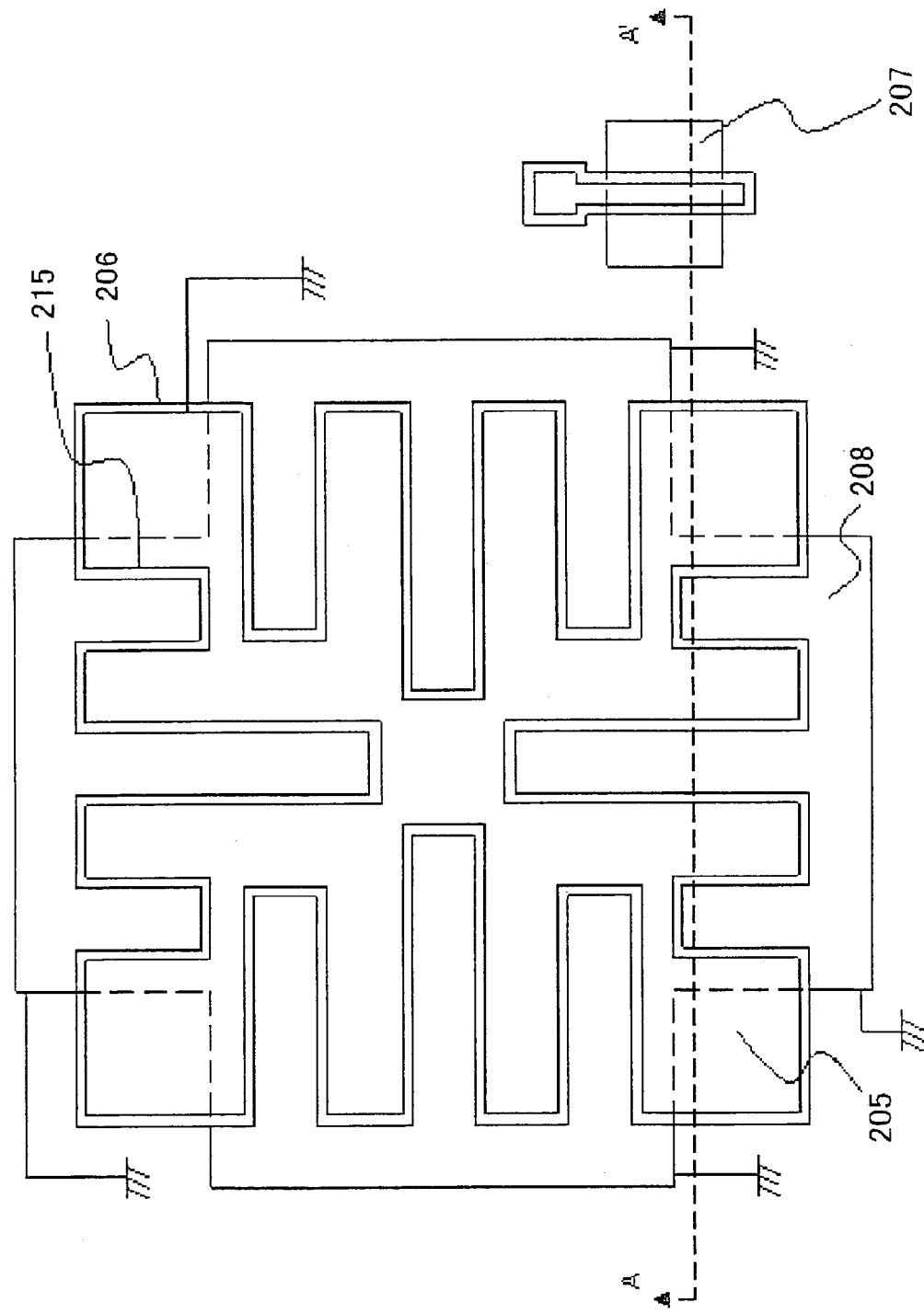
FIG. 11 is a plan view of a conventional semiconductor device, showing configurations of a polysilicon, a side wall, and a metal silicide.

A basic configuration of the semiconductor device shown in FIG. 5 and FIG. 6 is similar to the semiconductor device of first embodiment, except that the two-dimensional geometry of the polysilicon 105 and the metal silicide 108 in the shield pattern is the geometry as described above in reference to FIG. 11.

In addition, as shown in FIG. 5 and FIG. 6, the dummy pattern in the region for forming the spiral inductor 120 in the present embodiment is also different therefrom, in respect of having embedded regions of the element isolating oxide film 102 existing in a form of a plurality of islands in substrate remaining region 131. The element isolating oxide film 102 provided in the form of islands functions as a dummy pattern for inhibiting a variation in the film thickness during the process for manufacturing the element isolating oxide film 102, and the two-dimensional geometry and the two-dimensional arrangement thereof are in a geometry of a tetragonal lattice to form a dot pattern, similarly as in the case of the substrate remaining region 131 in first embodiment. This semiconductor device is manufactured by forming a dummy pattern having embedded regions of the element isolating oxide film 102 arranged in a form of a plurality of islands in the substrate remaining region 131 in the region for forming the spiral inductor 120.

Figure 12:
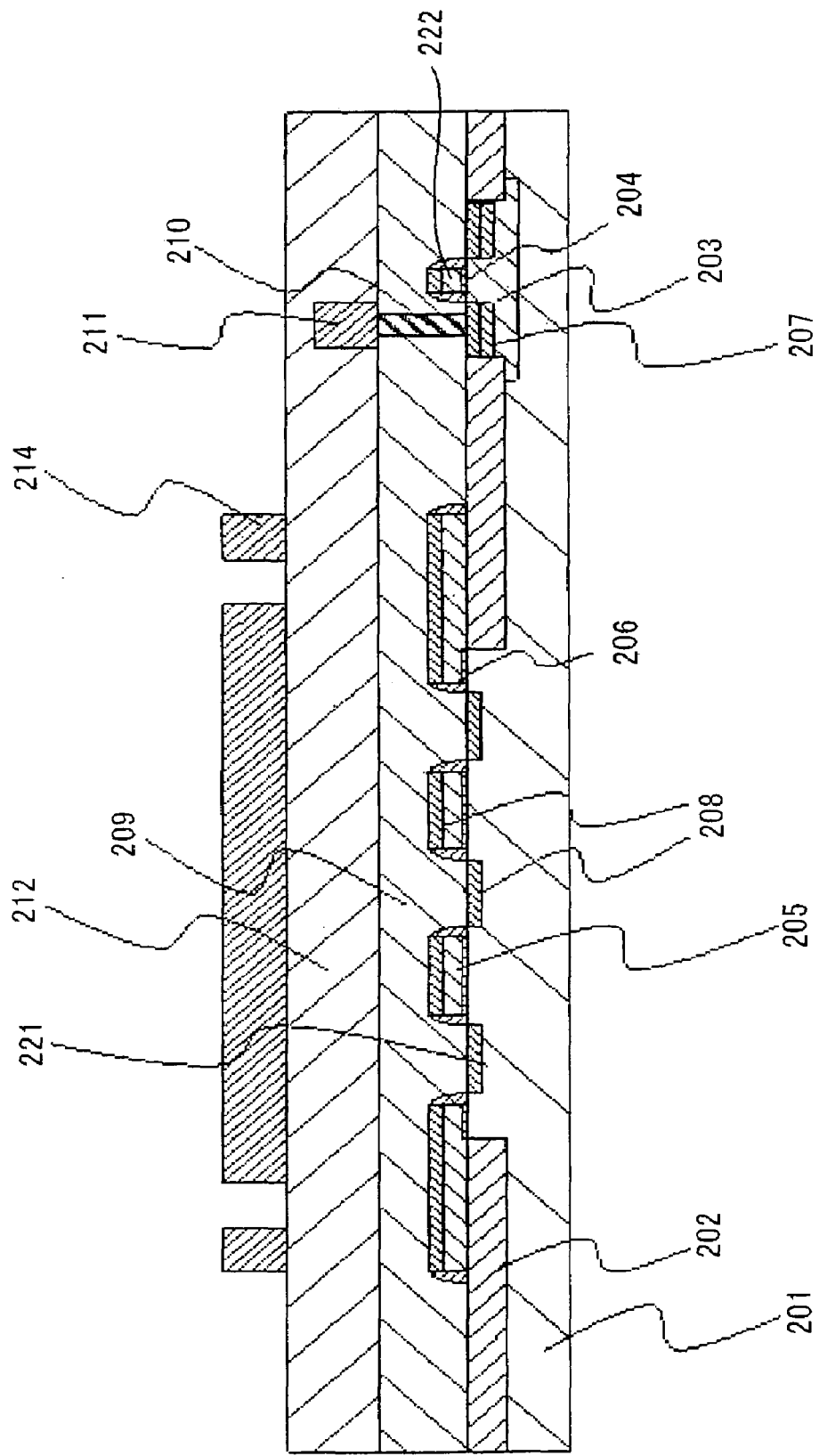
FIG. 12 is a cross-sectional view of the semiconductor device shown in FIG. 11 along line A-A'.

In the semiconductor device of the present embodiment (FIG. 5 and FIG. 6), the dot pattern of the element isolating oxide film 102 is provided in the region for forming the polysilicon 105. Thus, unlike the configuration described above in reference to FIG. 11 and FIG. 12, a configuration, in which the surface of the silicon substrate 121 is not remained over larger area right under the polysilicon 105, can be presented. Thus, ratio of area occupied by the element isolating oxide film 102 can be increased, and therefore a configuration for allowing an inhibition in creating the field step in the process for forming the element isolating oxide film 102 by STI process can be presented. In addition, the process can be designed to leave no oxide film, which should be removed, on the surface of the silicon substrate 101 after the completion of STI process. Thus, in the present embodiment, the fluctuation in the gate length due to the field step can be inhibited while fully ensuring the shielding ability between the spiral inductor 120 and the silicon substrate 101, similarly as in first embodiment, thereby presenting a configuration of providing an improved manufacturing stability.

While the embodiments of the present invention have been described above in reference to the annexed figures, it should be understood that the disclosures above are presented for the purpose of illustrating the present invention, and various configurations other than the above described configurations can also be adopted.

For example, while the case of arranging the substrate remaining region 131 or the element isolating oxide film 102 right under the polysilicon 105 in the form of the square-dot two-dimensional geometry has been described in the above-described embodiments, it is not necessary to employ the dot pattern for the dummy pattern, and a slit pattern, in which the silicon substrate 101 is remained in a form of a stripe from the upper viewpoint, or an arbitrary polygonal two-dimensional geometry may be employed.

In addition, while the case of arranging a plurality of dot-shaped substrate remaining region 131 or element isolating oxide film 102 in a form of a tetragonal lattice is described in the above embodiments, the two-dimensional arrangement of the dot pattern is not limited to the tetragonal lattice, and other forms of the lattice of, for example, a diagonal lattice such as a staggered lattice may be employed. In addition, the dot pattern may be arranged in the region right under the polysilicon 105 at random.

In addition, while the polysilicon 105 and the metal silicide 108 that compose the shield pattern is formed in the entire region for forming the spiral inductor 120 and the vicinity thereof in the above embodiments, it is sufficient to constitute such shield pattern of an electrically conducting film. Further, it is also sufficient to form at least such shield pattern in a region between the second layer metallic interconnect 114 and the first layer metallic interconnect 111 and the silicon substrate 101. The shielding effect can be more surely exhibited by providing the shield pattern of the metal silicide 108 in the entire region for forming the spiral inductor 120 including the region where these interconnects are not provided.

It is apparent that the present invention is not limited to the above embodiments, which may be modified and changed without departing from the scope and spirit of the invention.

What is claimed is:

1. A semiconductor device, comprising:
   a semiconductor substrate;
   an insulating film embedded in said semiconductor substrate;
   an insulating interlayer provided on said semiconductor substrate;
   a spiral inductor provided on said insulating interlayer; and
   a first shielding layer provided between said spiral inductor and said semiconductor substrate as being insulated from a surface of said semiconductor substrate, said first shielding layer elongating toward a direction along the surface of the substrate to provide a shield between said spiral inductor and said semiconductor substrate,
   wherein a dummy pattern composed of an embedded region of said insulating film and a remaining region of said semiconductor substrate from the upper viewpoint is provided in a predetermined region in the surface of said semiconductor substrate,
   in the region for forming said spiral inductor, said dummy pattern is selectively provided only in the region that is right under said first shielding layer, and
   said dummy pattern in the region for forming said spiral inductor includes a geometric relationship, in which one of said embedded region and said remaining region is partially included in the other thereof in a form of a plurality of islands.

2. The semiconductor device according to claim 1, wherein said dummy pattern in the region for forming said spiral inductor includes a geometric relationship, in which said remaining portion is partially included in said embedded region in a form of a plurality of islands.

3. The semiconductor device according to claim 1, wherein said dummy pattern in the region for forming said spiral inductor includes a geometric relationship, in which said embedded region is partially included in said remaining region in a form of a plurality of islands.

4. The semiconductor device according to claim 1, wherein said first shielding layer is composed of a first electrically conducting film provided with a cutout portion that extends from a circumference portion toward the inside of said first electrically conductive film from the upper viewpoint, and
   wherein said semiconductor device further comprises a second shielding layer composed of a second electrically conducting film, said second electrically conducting film being provided in a region for forming said cutout portion, having a two-dimensional geometry corresponding to a two-dimensional geometry of said cutout portion, and being provided so as to contact with the surface of said semiconductor substrate.

5. The semiconductor device according to claim 2, wherein said first shielding layer is composed of a first electrically conducting film provided with a cutout portion that extends from a circumference portion toward the inside of said first electrically conductive film from the upper viewpoint, and wherein said semiconductor device further comprises a second shielding layer composed of a second electrically conducting film, said second electrically conducting film being provided in a region for forming said cutout portion, having a two-dimensional geometry corresponding to a two-dimensional geometry of said cutout portion, and being provided so as to contact with the surface of said semiconductor substrate.

6. The semiconductor device according to claim 3, wherein said first shielding layer is composed of a first electrically conducting film provided with a cutout portion that extends from a circumference portion toward the inside of said first electrically conductive film from the upper viewpoint, and wherein said semiconductor device further comprises a second shielding layer composed of a second electrically conducting film, said second electrically conducting film being provided in a region for forming said cutout portion, having a two-dimensional geometry corresponding to a two-dimensional geometry of said cutout portion, and being provided so as to contact with the surface of said semiconductor substrate.

7. A method for manufacturing a semiconductor device, including:

forming a dummy pattern by providing a concave portion in a semiconductor substrate and forming an insulating film so as to fill the concave portion, said dummy pattern being composed of an embedded region of said insulating film and a remaining region of said semiconductor substrate from the upper viewpoint in a predetermined region in a surface of said semiconductor substrate;

forming an electrically conducting film that functions as a shielding layer on said semiconductor substrate in the region where a spiral inductor is formed, so as to provide an insulation from the surface of said semiconductor substrate;

forming an insulating interlayer on entire of an upper surface of said semiconductor substrate provided with said electrically conducting film; and forming said spiral inductor on said insulating interlayer, wherein in the region for forming said spiral inductor, said dummy pattern is selectively formed only in the region that is right under the region where said electrically conducting film is formed, and the dummy pattern in the region for forming said spiral inductor includes a geometric relationship, in which one of said embedded region and said remaining region is partially included in the other thereof in a form of a plurality of islands.

8. The method according to claim 7, wherein the dummy pattern in the region for forming said spiral inductor includes a geometric relationship, in which said remaining region is partially included in said embedded region in a form of a plurality of islands.

9. The method according to claim 7, wherein the dummy pattern in the region for forming said spiral inductor includes a geometric relationship, in which said embedded region is partially included in said remaining region in a form of a plurality of islands.

10. A semiconductor device, comprising a semiconductor substrate;

an insulating film embedded in said semiconductor substrate;

an insulating interlayer on said semiconductor substrate;

a spiral inductor on said insulating interlayer; and a first shielding layer between said spiral inductor and said semiconductor substrate, wherein a dummy pattern composed of said embedded insulating film and a region of said semiconductor substrate absent said embedded insulating film is in a first surface of said semiconductor substrate, said dummy pattern being only in a region that is directly under said first shielding layer, and wherein said dummy pattern alternates between said embedded insulating film and said region absent said embedded insulating film in a form of a plurality of islands.

11. The semiconductor device according to claim 10, wherein said first shielding layer is composed of a first electrically conducting film provided with a cutout portion that extends from a circumference portion toward an inside of said first electrically conductive film, and wherein said semiconductor device further comprises a second shielding layer composed of a second electrically conducting film, said second electrically conducting film being provided in a region for forming said cutout portion, having a two-dimensional geometry corresponding to a two-dimensional geometry of said cutout portion, and being in contact with the surface of said semiconductor substrate.

* * * * *